United States Patent [19]

Aoyama et al.

[11] Patent Number: 5,630,904
[45] Date of Patent: May 20, 1997

[54] STRIPPING AND CLEANING AGENT FOR REMOVING DRY-ETCHING AND PHOTORESIST RESIDUES FROM A SEMICONDUCTOR SUBSTRATE, AND A METHOD FOR FORMING A LINE PATTERN USING THE STRIPPING AND CLEANING AGENT

[75] Inventors: Tetsuo Aoyama; Rieko Nakano, both of Niigata; Akira Ishihama; Koichiro Adachi, both of Nara, all of Japan

[73] Assignees: Mitsubishi Gas Chemical Co., Inc., Tokyo; Sharp Kabushiki Kaisha, Osaka, both of Japan

[21] Appl. No.: 410,726

[22] Filed: Mar. 27, 1995

[30] Foreign Application Priority Data

Mar. 28, 1994 [JP] Japan ..................... 6-082518

[51] Int. Cl.⁶ ......................... C09K 13/00
[52] U.S. Cl. .................. 438/669; 252/79.1; 134/2; 438/963; 438/704
[58] Field of Search .............. 156/646.1, 643.1, 156/656.1; 252/79.1, 79.2, 79.3, 79.4; 134/2, 3

[56] References Cited

U.S. PATENT DOCUMENTS

| | | | |
|---|---|---|---|
| 5,174,816 | 12/1992 | Aoyama et al. | 106/203 |
| 5,244,539 | 9/1993 | McGrath et al. | 252/79.2 X |
| 5,378,312 | 1/1995 | Gifford et al. | 156/643.1 |

*Primary Examiner*—Thi Dang
*Attorney, Agent, or Firm*—Sughrue, Mion, Zinn, Macpeak & Seas

[57] ABSTRACT

Stripping and cleaning agent for removing dry-etching photoresist residues, and a method for forming an aluminum based line pattern using the stripping and cleaning agent. The stripping and cleaning agent contains (a) from 5 to 50% by weight of an organocarboxlic ammonium salt or an amine carboxylate, represented by the formula $[R^1]m[COONH_p(R^2)q]n$, where $R^1$ is hydrogen, or an alkyl or aryl group having from 1 to 18 carbon atoms; $R^2$ is hydrogen, or an alkyl group having from 1 to 4 carbon atoms; m and n independently are integers of from 1 to 4, p is integer of from 1 to 4, q is integer of from 1 to 3, and p+q=4 and (b) from 0.5 to 15% by weight of a fluorine compound. The inventive method is advantageously applied to treating a dry-etched semiconductor substrate with the stripping and cleaning agent. The semiconductor substrate comprises a semiconductor wafer having thereon a conductive layer containing aluminum. The conductive layer is dry-etched through a patterned photoresist mask to form a wiring body having etched side walls. The dry etching forms a side wall protection film on the side walls. In accordance with the inventive method, the side wall protection film and other resist residues are completely released without corroding the wiring body.

19 Claims, 1 Drawing Sheet

STRIPPING AND CLEANING AGENT FOR REMOVING DRY-ETCHING AND PHOTORESIST RESIDUES FROM A SEMICONDUCTOR SUBSTRATE, AND A METHOD FOR FORMING A LINE PATTERN USING THE STRIPPING AND CLEANING AGENT

BACKGROUND OF THE INVENTION

1. Field of the Invention

The present invention is directed to a method for surface treatment of a semiconductor substrate. More particularly, the present invention is directed to a stripping and cleaning agent for removing dry-etching photoresist residues, and a method for forming an aluminum based line pattern characterized in that a side wall protection film formed in a dry-etching step is removed from the semiconductor substrate.

2. Description of the Related Art

Recently, in an aluminum wiring technique in which a logic LSI or memory KSI is formed on a semiconductor wafer comprising a silicon single crystal, electro-migration and stress migration, etc., occur with increased density of the integrated circuit. These migrations are inhibited by using an aluminum alloy (Al—Si—Cu etc.) as a wire material containing a small amount of Cu, etc.

The process for making a wiring body from an aluminum alloy is as follows:

First, (1) a film or layer of the above-described Al—Si—Cu alloy is sputtered onto a semiconductor wafer having thereon a diffusing layer and an electrical insulating layer.

Next, (2) a resist film or layer is applied onto the Al—Si—Cu layer. Then, a fine pattern is formed thereon using a photolithographic technique.

Then, (3) the resist film is cured by irradiating the entire area of the semiconductor substrate with UV light, to thereby increase the dry-etching resistance of the resist pattern.

Furthermore, the above-described Al—Si—Cu alloy layer is dry-etched using the resist pattern as a mask to form a line pattern.

In this process, a chlorine containing gas, such as $BCl_3$—$Cl_2$, etc., or a gas further containing a Freon series gas, such as $CF_4$ and $CHF_3$ etc., is usually used as a dry-etching gas. A side wall protection film which is a reaction product of the etching step becomes attached on the side wall of the pattern of the resist film and the Al—Si—Cu alloy layer. On the other hand, the chlorine gas used in the dry etching step reacts with aluminum in the wiring body to form a compound, such as aluminum chloride, in the side wall protection film. The aluminum chloride reacts with water in the air to form hydrogen chloride. The hydrogen chloride corrodes the Al—Si—Cu alloy and this causes the wire to snap. This type of corrosion is described in *Monthly SEMICON NEWS*, October 1988, at page 44. To prevent such corrosion, methods comprising heating the wafer after the etching step, or using purified water for cleaning, etc., have been proposed. However, good results are not obtained from these methods. Namely, to prevent the above-described corrosion, the side wall protection film should be completely removed.

Methods that have been proposed for removing the side wall protection film usually include the use of a wet stripping and cleaning agent, such as an organic stripping and cleaning agent, an acidic stripping and cleaning agent and an alkaline stripping and cleaning agent. However, it is difficult to completely release the side wall protection film by using these stripping and cleaning agents. Furthermore, in the case of an organic stripping and cleaning agent, high temperature heating is necessary and an organic solvent, such as isopropanol, etc., is necessary as a rinse liquid. Thus, this technique is complicated and also presents a safety problem.

In the case of an acidic and an alkaline stripping and cleaning agent, the aluminum alloy layer tends to corrode. Thus, these stripping and cleaning agents cannot be used to process an extremely fine line pattern.

Therefore, there is a need in the art for a stripping and cleaning agent and a method for forming a line pattern using such a liquid to completely release the side wall protection film, which stripping and cleaning agent does not corrode a wiring body comprising aluminum.

SUMMARY OF THE INVENTION

The present invention solves the above-described problems of the prior art, and provides a resist stripping and cleaning agent and method for forming an ultra fine line pattern using the stripping and cleaning agent, without corroding the aluminum wiring body. Also, the side wall protection film is safely, efficiently and completely removed.

The present inventors have extensively studied the above-described problems, and as a result, have found that the above objectives are achieved by providing a semiconductor substrate comprising a semiconductor wafer having thereon a conductive layer containing aluminum, dry etching the conductive layer through a patterned photoresist mask to form a wiring body having etched side walls and a side wall protection film on said side walls; and removing the side wall protection film by treating the dry-etched semiconductor substrate with a stripping and cleaning agent comprising:

(a) an organocarboxlic ammonium salt or amine carboxylate, and (b) an aqueous solution of a fluorine compound.

In a preferred embodiment, the stripping and cleaning agent further comprises an organic solvent selected from the group consisting of amides, lactones, nitriles, alcohols and esters. The stripping and cleaning agent of the present invention does not corrode the aluminum wiring body. Also, the side wall protection film formed during the dry-etching step is completely removed, to thereby obtain an ultra fine line pattern.

DESCRIPTION OF THE PREFERRED EMBODIMENTS

Figure 1:
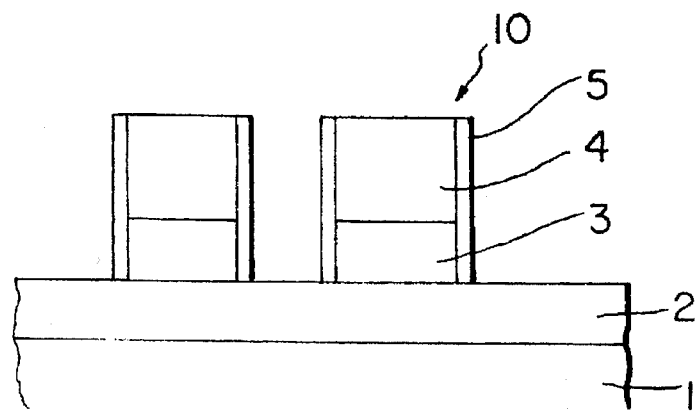
FIG. 1 is a first example of a cross-sectional view of a semiconductor substrate after dry etching.

The present invention is described in more detail below.

The ammonium salt of an organocarboxylic acid or the amine salt of an organocarboxylic acid of the present invention is represented by the following formula:

where $R^1$ is hydrogen, or an alkyl or aryl group having from 1 to 18 carbon atoms; $R^2$ is hydrogen, or an alkyl group having from 1 to 4 carbon atoms; m and n independently are integers of from 1 to 4, p is integer of from 1 to 4, q is integer of 1 to 3, and p+q=4.

The ammonium salt of an organocarboxylic acid of the present invention includes, for example, ammonium compounds of an aliphatic carboxylic acid, such as ammonium formate, ammonium acetate, ammonium propionate, ammonium butyrate, ammonium valerate, ammonium heptanate, ammonium laurate, ammonium palmitate, ammonium stearate, ammonium acrylate, ammonium crotonate, ammonium methacrylate, ammonium oxalate, ammonium malonate, ammonium maleate, ammonium fumarate, ammonium succinate, ammonium adipate, ammonium azelate, ammonium sebacate; and in addition, ammonium compounds of an aromatic carboxylic acid, such as ammonium benzoate, ammonium toluate, ammonium phthalate, ammonium trimellitate and ammonium pyromellitate.

The amine salt of an organocarboxylic acid of the present invention includes, for example, the amine salt of an organic carboxylic acid, such as monomethylamine formate, dimethylamine formate, trimethylamine formate, monoethylamine formate, diethylamine formate, triethylamine formate, monomethylamine acetate, dimethylamine acetate, trimethylamine acetate, monoethylamine acetate, diethylamine acetate, triethylamine acetate, monomethylamine benzoate, dimethylamine benzoate, trimethylamine benzoate, monoethylamine benzoate, diethylamine benzoate and triethylamine benzoate.

The organocarboxlic ammonium salt or amine carboxylate is preferably used in a concentration of from 5 to 50% by weight of the stripping and cleaning agent. When the concentration is less than 5% by weight, the aluminum wiring body corrodes excessively. When the concentration is greater than 50%, the removing ability of the side wall protection film is decreased.

Examples of the fluorine compound for use in the present invention include hydrofluoric acid, ammonium fluoride, ammonium hydrofluoride, ammonium borofluoride, etc. The fluorine compound is used in a concentration of from 0.5 to 15% by weight of the stripping and cleaning agent. When the concentration of the fluorine compound is less than 0.5% by weight, the removing ability of the side wall protection film is decreased. When the concentration is greater than 15%, the aluminum wiring body corrodes excessively.

Examples of the organic solvent for use in the present invention include, for example, amide, such as dimethylformamide, dimethylacetoamide, N-methyl pyrrolidone; nitrils, such as γ-butyrolactone; alcohols, such as methanol, ethanol, isopropanol, ethyleneglycol, etc.; and esters, such as methyl acetate, ethyl acetate, etc. The organic solvent is preferably used in a concentration of from 1 to 50% by weight of the stripping and cleaning agent. When the concentration is less than 1% by weight, the aluminum wiring body corrodes excessively. When the concentration is greater than 50%, the removing ability of the side wall protection film is decreased.

Furthermore, the total amount of the organocarboxlic ammonium salt or amine carboxylate and the organic solvent is preferably used in a concentration of from 10 to 80% by weight of the stripping and cleaning agent. When either the concentration of the organic solvent is small or the organic solvent is not added, and at the same time the concentration of both the organocarboxlic ammonium salt or amine carboxylate is small, the aluminum wiring body corrodes excessively, and the removing ability of the side wall protection film is decreased.

The dry etching gas for use in the present invention comprises, for example, a gas selected from chlorine, hydrogen bromide and boron trichloride. The dry-etching gas may further include a fluorine-containing gas, such as carbon tetrafluoride, sulfur hexafluoride, boron trifluoride, etc.; and a chlorine-containing gas, such as hydrogen chloride, carbon tetrachloride and silicon tetrachloride.

In accordance with the present invention, the removing step may be conducted at a temperature around room temperature. However, if the removing step is difficult to carry out at the room temperature, then the removing step may be conducted at an elevated temperature. The time needed to carry out the method of the present invention is not particularly limited. The processing time can be selected depending on the condition of the side wall protection film, the composition of the aluminum series wiring body, etc.

Furthermore, because the stripping and cleaning agent of the present invention can completely remove the resist resin after ashing, and does not corrode the aluminum series wiring body, the stripping and cleaning agent of this invention can also be used as a microstripper in a washing step of aluminum based wiring.

The present invention is described in more detail by reference to the following Examples, but the present invention should not be construed as being limited thereto.

EXAMPLES

Example 1

Figure 2:
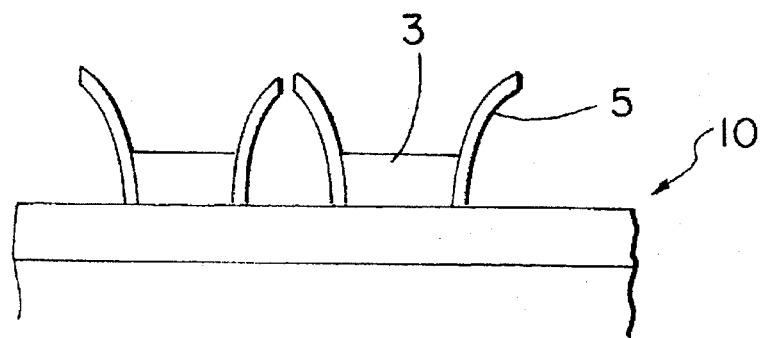
FIG. 2 is a cross-sectional view of the semiconductor substrate of FIG. 1 after dry etching and removing the photoresist masking pattern.

FIG. 1 is a cross-sectional view of a first example of a semiconductor substrate 10 after dry-etching. 1 is a semiconductor wafer which may be a silicon wafer, 2 is an oxidized film or oxide layer formed on the semiconductor wafer 1, 3 is an Al based wiring body or Al metallization pattern formed on the oxide layer 2, 4 is a photoresist film or layer which is patterned using a photolithography technique. The Al wiring body was formed by sputtering an Al alloy layer onto the oxide layer 2. Photoresist was then coated onto the oxide layer, exposed and developed to form a photoresist pattern. The patterned wafer was then dry-etched with a gas containing HBr using the photoresist pattern as an etching mask, to thereby etch the exposed Al alloy (not shown in FIG. 1). At this stage, a residue comprising a photoresist residue and an etching residue (side wall protection film) 5, attached to the side walls of the Al wiring body 3 and the resist film 4. As shown in FIG. 2, the resist film 4 was removed by a photoresist ashing method using an oxygen plasma. At this time, the residue 5 was not removed by the oxygen plasma, and the upper part of the residue (side wall protection film) was deformed as it opened away from the center of the Al wiring body 3.

After conducting the resist ashing as shown in FIG. 2, the substrate 10 having thereon residue (side wall protection film) 5 was immersed at 25° C. for 5 minutes in a stripping and cleaning agent comprising 50% by weight ammonium acetate, 5% by weight ammonium fluoride and the balance water. After immersion, the wafer was rinsed with ultra pure water, dried, and then observed with an scanning electron microscope (SEM).

As a result, the side wall protection film 5 of the patterned wiring body was completely removed, and no corrosion of the aluminum wiring body was observed. Furthermore, resist residues in addition to the side wall protection film were also completely removed.

Example 2

The substrate 10 of Example 1 after ashing and having the structure of FIG. 2 including the residue (side wall protection film) 5 was immersed at 23° C. for 5 minutes in a stripping and cleaning agent comprising 40% by weight of the monomethyl amine salt of benzoic acid, 5% by weight ammonium borofluoride and the balance water. After the immersion, the wafer was rinsed with deionized water, dried and then observed with a SEM.

As a result, the side wall protection film 5 was completely removed, and no corrosion of the aluminum wiring body 3 or oxide layer 2 was observed. Furthermore, resist residues in addition to the side wall protection film were also completely removed.

Example 3

Figure 3:
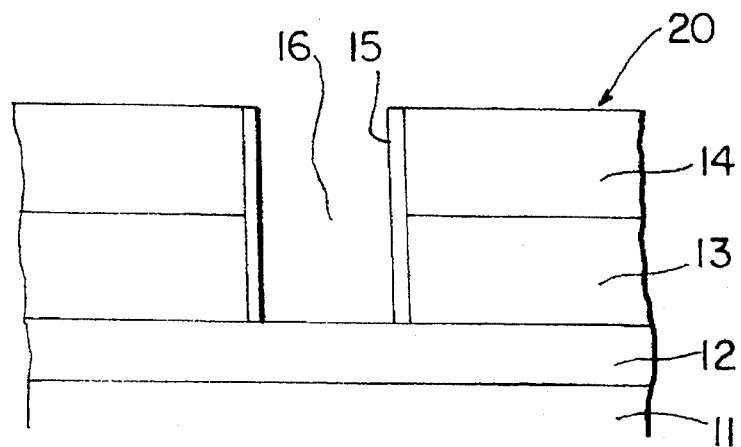
FIG. 3 is a second example of a cross-sectional view of a semiconductor substrate after dry etching.

FIG. 3 shows a second example of a cross sectional view of a semiconductor substrate after dry-etching. 11 is a semiconductor wafer, 12 is an Al alloy layer or layer formed on the semiconductor wafer 11, 13 is an oxidized film or oxide layer formed on the Al alloy layer, 14 is a patterned photoresist film or layer provided on the oxide layer. Using the photoresist film 14 as a mask, dry-etching was conducted using an etching gas containing HBr gas to form viahole 16. During the dry-etching, a residue (side wall protection film) 15 comprising a resist residue and a dry-etching residue attached to the side walls of the viahole 16 and was not removed during a subsequent photoresist ashing step. The substrate having the remaining residue (side wall protection film) 15 was immersed at 25° C. for 5 minutes in a stripping and cleaning agent comprising 10% by weight ammonium acetate, 5% by weight ammonium fluoride, 40% by weight dimethyl formamide and the balance water. After the immersion, the wafer was rinsed with ultra pure water, dried, and then observed with a SEM.

As a result, the side wall protection film 5 was completely removed, and no corrosion of the aluminum alloy layer 12 and oxide layer 13 was observed. Furthermore, resist residues in addition to the side wall protection film were also completely removed.

Example 4

The substrate 10 of Example 1 after ashing and having the structure of FIG. 2 including the residue (side wall protection film) 5 was immersed at 20° C. for 5 minutes in a stripping and cleaning agent comprising 0.8% by weight ammonium hydrogen fluoride, 10% by weight trimethyl amine formate, 40% by weight ethyleneglycol and the balance water. After the immersion, the wafer was rinsed with ultra pure water, dried, and then observed with a SEM.

As a result, the side wall protection film 5 was completely removed, and no corrosion of the aluminum wiring body 3 and oxide layer 2 was observed. Furthermore, resist residues in addition to the side wall protection film were also completely removed.

Example 5

The substrate 10 of Example 1 after ashing and having the structure of FIG. 2 including the residue (side wall protection film) 5 was immersed at 23° C. for 10 minutes in a stripping and cleaning agent comprising 15% by weight ammonium formate, 5% by weight ammonium fluoride, 30% by weight dimethyl acetoamide and the balance water. After the immersion, the wafer was rinsed with ultra pure water, dried, and then observed with a SEM.

As a result, the side wall protection film 5 was completely removed, and no corrosion of the aluminum wiring body 3 and oxide layer 2 was observed. Furthermore, resist residues in addition to the side wall protection film were also completely removed.

Example 6

The substrate 10 of Example 1 after ashing and having the structure of FIG. 2 including the residue (side wall protection film) 5 was immersed at 23° C. for 10 minutes in a stripping and cleaning agent comprising 30% by weight ammonium phthalate, 3% by weight ammonium fluoride, 20% by weight N-methyl pyrrolidone and the balance water. After the immersion, the wafer was rinsed with ultra pure water, dried, and then observed with a SEM.

As a result, the side wall protection film 5 was completely removed, and no corrosion of the aluminum wiring body 3 and oxide layer 2 was observed. Furthermore, resist residues in addition to the side wall protection film were also completely removed.

Example 7

The substrate 10 of Example 3 after ashing and having the structure of FIG. 3 including the residue (side wall protection film) 15 was immersed at 25° C. for 10 minutes in a stripping and cleaning agent comprising 40% by weight trimethylamine acetate, 3% by weight ammonium fluoride, 7% by weight dimethyl formamide and the balance water. After the immersion, the wafer was rinsed with ultra pure water, dried, and then observed with a SEM.

As a result, the side wall protection film 15 was completely removed, and no corrosion of the aluminum alloy layer 12 or oxide layer 13 was observed. Furthermore, resist residues in addition to the side wall protection film were also completely removed.

Comparative Example 1

The substrate 10 of Example 1 after ashing and having the structure of FIG. 2 including the residue (side wall protection film) 5 was immersed at 25° C. for 5 minutes in a stripping and cleaning agent comprising 5% by weight ammonium fluoride and the balance water. After the immersion, the wafer was rinsed with ultra pure water, dried, and then observed with a SEM.

As a result, the side wall protection film 5 was completely removed. However, there was extensive corrosion of the aluminum wiring body 3 and the oxide layer 2.

Comparative Example 2

The substrate 10 of Example 3 after ashing and having the structure of FIG. 3 including the residue (side wall protection film) 15 was immersed at 25° C. for 10 minutes in a stripping and cleaning agent comprising 10% by weight ammonium acetate, 40% by weight dimethyl formamide and the balance water. After the immersion, the wafer was rinsed with ultra pure water, dried, and then observed with a SEM.

As a result, the side wall protection film 15 was not removed to an appreciable extent.

As described above, the stripping and cleaning agent and method of the present invention completely remove the side wall protection film of an aluminum wiring body that has been patterned by dry-etching using a photoresist pattern as a mask without corrosion of the aluminum alloy layer and underlying oxide layer. Furthermore, resist residues in addition to the side wall protection film are also completely removed.

While the invention has been described in detail and with reference to specific embodiments thereof, it will be apparent to one skilled in the art that various changes and modifications can be made therein without departing from the spirit and scope thereof.

What is claimed is:

1. A method for forming a line pattern comprising:
providing a semiconductor substrate comprising a semiconductor wafer having thereon a conductive layer containing aluminum;
dry etching the conductive layer through a patterned photoresist mask to form a wiring body having etched side walls and a side wall protection film on said side walls; and
releasing the side wall protection film by treating the dry-etched semiconductor substrate with a stripping and cleaning agent comprising:
(a) from 5 to 50% by weight of an organocarboxylic ammonium salt or an amine carboxylate, represented by the formula $[R^1]m[COONH_p(R^2)q]n$, where $R^1$ is hydrogen, or an alkyl or aryl group having from 1 to 18 carbon atoms; $R^2$ is hydrogen, or an alkyl group having from 1 to 4 carbon atoms; m and n independently are integers of from 1 to 4, p is an integer of from 1 to 4, q is an integer of from 1 to 3, and p+q=4; and
(b) from 0.5 to 15% by weight of a fluorine compound.

2. The method of claim 1, wherein the stripping and cleaning agent further comprises (c) from 1 to 50% by weight of at least one organic solvent selected from the group consisting amides, lactones, nitriles, alcohols and esters.

3. The method of claim 1, wherein the dry-etching gas is selected from the group consisting of chlorine gas, hydrogen bromide gas and boron trichloride gas.

4. The method of claim 1, wherein the organocarboxylic ammonium salt is selected from the group consisting of ammonium formate, ammonium acetate, ammonium propionate, ammonium butyrate, ammonium valerate, ammonium heptanate, ammonium laurate, ammonium palmitate, ammonium stearate, ammonium acrylate, ammonium crotonate, ammonium methacrylate, ammonium oxalate, ammonium malonate, ammonium maleate, ammonium fumarate, ammonium succinate, ammonium adipate, ammonium azelate, ammonium sebacate, ammonium benzoate, ammonium toluate, ammonium phthalate, ammonium trimellitate and ammonium pyromellitate.

5. The method of claim 1, wherein the organocarboxylic amine salt is selected from the group consisting of monomethylamine formate, dimethylamine formate, trimethylamine formate, monoethylamine formate, diethylamine formate, triethylamine formate, monoethylamine acetate, dimethylamine acetate, trimethylamine acetate, monoethylamine acetate, diethylamine acetate, triethylamine acetate, monomethylamine benzoate, dimethylamine benzoate, trimethylamine benzoate, monoethylamine benzoate, diethylamine benzoate and triethylamine benzoate.

6. The method of claim 1, wherein the organocarboxylic ammonium salt is selected from the group consisting of ammonium acetate, ammonium propionate, ammonium phthalate and ammonium formate.

7. The method of claim 1, wherein the organocarboxylic amine salt is selected from the group consisting of monomethylamine formate, triethylamine formate and monomethylamine benzoate.

8. The method of claim 1, wherein the fluorine compound is selected from the group consisting of hydrofluoric acid, ammonium fluoride, ammonium hydrofluoride and ammonium borofluoride.

9. The method of claim 1, wherein the organic solvent is selected from the group consisting of dimethylformamide, dimethylacetoamide, N-methylpyrrolidone, γ-butyrolactone, methanol, ethanol, isopropanol, ethyleneglycol, methyl acetate and ethyl acetate.

10. The method of claim 1, wherein the organic solvent is selected from the group consisting of dimethylformamide, ethyleneglycol dimethylacetoamide and N-methyl pyrrolidone.

11. A stripping and cleaning agent for removing dry-etching photoresist residues from a semiconductor substrate having thereon an aluminum based wiring body formed in a dry-etching step using a photoresist pattern as an etching mask, comprising:
(a) from 5 to 50% by weight of an organocarboxylic ammonium salt or an amine carboxylate, represented by the formula $[R^1]m[COONH_p(R^2)q]n$, where $R^1$ is hydrogen, or an alkyl or aryl group having from 1 to 18 carbon atoms; $R^2$ is hydrogen, or an alkyl group having from 1 to 4 carbon atoms; m and n independently are integers of from 1 to 4, p is an integer of from 1 to 4, q is an integer of from 1 to 3, and p+q=4; and
(b) from 0.5 to 15% by weight of a fluorine compound.

12. A stripping and cleaning agent for removing dry-etching photoresist residues from a semiconductor substrate having thereon an aluminum based wiring body formed in a dry-etching step using a photoresist pattern as an etching mask, comprising:
(a) from 5 to 50% by weight of an organocarboxylic ammonium salt or an amine carboxylate, represented by the formula $[R^1]m[COONH_p(R^2)q]n$, where $R^1$ is hydrogen, or an alkyl or aryl group having from 1 to 18 carbon atoms; $R^2$ is hydrogen, or an alkyl group having from 1 to 4 carbon atoms; m and n independently are integers of from 1 to 4, p is an integer of from 1 to 4, q is an integer of from 1 to 3, and p+q=4;
(b) from 0.5 to 15% by weight of a fluorine compound; and
(c) from 1 to 50% by weight of at least one organic solvent selected from the group consisting amides, lactones, nitriles, alcohols and esters.

13. The stripping and cleaning agent of claim 11 or 12, wherein component (a) is said organocarboxylic ammonium salt and said salt is selected from the group consisting of ammonium formate, ammonium acetate, ammonium propionate, ammonium butyrate, ammonium valerate, ammonium heptanate, ammonium laurate, ammonium palmitate, ammonium stearate, ammonium acrylate, ammonium crotonate, ammonium methacrylate, ammonium oxalate, ammonium malonate, ammonium maleate, ammonium fumarate, ammonium succinate, ammonium adipate, ammonium azelate, ammonium sebacate, ammonium benzoate, ammonium toluate, ammonium phthalate, ammonium trimellitate and ammonium pyromellitate.

14. The stripping and cleaning agent of claim 11 or 12, wherein component (a) is said organocarboxylic amine salt and said salt is selected from the group consisting of monomethylamine formate, dimethylamine formate, trimethylamine formate, monoethylamine formate, diethylamine formate, triethylamine formate, monoethylamine acetate, dimethylamine acetate, trimethylamine acetate, monoethylamine acetate, diethylamine acetate, triethylamine acetate, monomethylamine benzoate, dimethylamine benzoate, trimethylamine benzoate, monoethylamine benzoate, diethylamine benzoate and triethylamine benzoate.

15. The stripping and cleaning agent of claim 11 or 12, wherein component (a) is said organocarboxylic ammonium salt and said salt is selected from the group consisting of ammonium acetate, ammonium propionate, ammonium phthalate and ammonium formate.

16. The stripping and cleaning agent of claim 11 or 12, wherein component (a) is said organocarboxylic amine salt and said salt is selected from the group consisting of monomethylamine formate, triethylamine formate and monomethylamine benzoate.

17. The stripping and cleaning agent of claim 11 or 12, wherein the fluorine compound is selected from the group consisting of hydrofluoric acid, ammonium fluoride, ammonium hydrofluoride and ammonium borofluoride.

18. The stripping and cleaning agent of claim 11 or 12, wherein the organic solvent is selected from the group consisting of dimethylformamide, dimethylacetoamide, N-methylpyrrolidone, γ-butyrolactone, methanol, ethanol, isopropanol, ethyleneglycol, methyl acetate and ethyl acetate.

19. The stripping and cleaning agent of claim 11 or 12, wherein the organic solvent is selected from the group consisting of dimethylformamide, ethyleneglycol dimethylacetoamide and N-methyl pyrrolidone.

* * * * *